(12) United States Patent
Murakami et al.

(10) Patent No.: US 6,468,826 B1
(45) Date of Patent: Oct. 22, 2002

(54) SOLID STATE IMAGE SENSOR USING AN INTERMEDIATE REFRACTIVE INDEX ANTIREFLECTION FILM AND METHOD FOR FABRICATING THE SAME

(75) Inventors: Ichiro Murakami; Yasutaka Nakashiba, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/507,603

(22) Filed: Feb. 18, 2000

Related U.S. Application Data

(62) Division of application No. 09/339,683, filed on Jun. 24, 1999, now Pat. No. 6,060,732.

(30) Foreign Application Priority Data

Jun. 24, 1999 (JP) ............................................ 10-177262

(51) Int. Cl.[7] .............................................. H01L 21/00
(52) U.S. Cl. ............................. 438/48; 438/72; 438/75; 438/60; 438/636; 257/436; 257/437; 257/225
(58) Field of Search .............................. 438/60, 75, 48, 438/72, 636; 257/437, 436, 225

(56) References Cited

U.S. PATENT DOCUMENTS

| | | | | |
|---|---|---|---|---|
| 5,424,775 A | * | 6/1995 | Kamisaka et al. | .......... 348/311 |
| 5,585,653 A | * | 12/1996 | Nakashiba | .................. 257/232 |
| 6,147,390 A | * | 11/2000 | Nakano et al. | ............. 257/437 |

FOREIGN PATENT DOCUMENTS

| | | | | |
|---|---|---|---|---|
| JP | 57-096535 | | 6/1982 | |
| JP | 63-014466 A | * | 1/1988 | ........... H01L/27/14 |
| JP | 04-056272 A | * | 2/1992 | |
| JP | 04-056273 A | * | 2/1992 | |
| JP | 04-152674 A | * | 5/1992 | ........... H01L/27/14 |
| JP | 4-206571 | | 7/1992 | |
| JP | 4-287365 | | 10/1992 | |
| JP | 06-140615 A | * | 5/1994 | |
| JP | 6-209100 | | 7/1994 | |
| JP | 6-260628 | | 9/1994 | |
| JP | 07-045808 A | * | 2/1995 | |
| JP | 8-148665 | | 6/1996 | |
| JP | 08-288490 A | * | 11/1996 | ......... H01L/27/148 |
| JP | 10-135438 A | * | 5/1998 | |
| JP | 10-284709 A | * | 10/1998 | |

OTHER PUBLICATIONS

Wolf et al., "Silicon Processing for the VLSI Era: vol. 1–Process Technology", Lattice Press, 1986, pp. 182–195.*

* cited by examiner

*Primary Examiner*—Eddie Lee
*Assistant Examiner*—José R Diaz

(57) ABSTRACT

In a solid state image sensor comprising a plurality of photoelectric conversion regions and a plurality of transfer regions which are formed in a principal surface of a semiconductor substrate, and a plurality of transfer electrodes formed above the transfer regions, a first insulating film, an antireflection film and a second insulating film are formed in the named order on the photoelectric conversion regions. The antireflection film has a refractive index larger than that of the second insulating film but smaller than that of the semiconductor substrate. The stacked film composed of the first insulating film, the antireflection film and the second insulating film, is formed, in the transfer regions, to extend over the transfer electrode which is formed a third insulating film formed on the semiconductor substrate. Preferably, an opening is formed to penetrate through the antireflection film, at a position above the transfer electrode, and after the second insulating film is formed, a sintering is carried out in a hydrogen atmosphere.

20 Claims, 18 Drawing Sheets

SOLID STATE IMAGE SENSOR USING AN INTERMEDIATE REFRACTIVE INDEX ANTIREFLECTION FILM AND METHOD FOR FABRICATING THE SAME

This application is a Divisional Application of allowed Application Ser. No. 09/339,683, filed on Jun. 24, 1999, now U.S. Pat. No. 6,060,732.

BACKGROUND OF THE INVENTION

1. Field of the Invention

The present invention relates to a solid state image sensor and a method for fabricating the same.

2. Description of Related Art

A CCD (charge coupled device) type solid state image sensor is so constructed that light is incident on an n-type semiconductor region formed in a surface of a P-type silicon substrate and an image signal is obtained from a signal charge in the -type semiconductor region.

Referring to FIG. 17, there is shown a sectional view of one example of the prior art solid state image sensor, which includes transfer electrodes 3 formed on a P-type silicon substrate 11 with a sixth insulating film 12f formed of a silicon oxide film being interposed between the transfer electrodes 3 and the P-type silicon substrate 11. In a surface of the substrate 11 between each pair of transfer electrodes 3, an n-type semiconductor region 17 is formed to constitute a photoelectric conversion region. Above this n-type semiconductor region 17, an aperture is formed in a light block film 16 formed of aluminum or tungsten. A passivation film 18 is formed to cover the light block film 16. Furthermore, on the surface of the substrate It under the transfer electrode 3, a second n-type semiconductor region 21 is formed to constitute a transfer region, and one end of the second n-type semiconductor region 21 is separated from the n-type semiconductor region 17. A $p^+$ semiconductor region 26 is formed between the other end of the second n-type semiconductor region 21 and the n-type semiconductor region 17 in order to isolate pixels from one another. In the following, this prior art will be called a first prior art.

In the structure of the first prior art shown in FIG. 17, however, the loss of an incident light is large because of reflection at the surface of the P-type silicon substrate 11, and therefore, a satisfactory sensitivity cannot be obtained.

In order to overcome this problem, for example, Japanese Patent Application Pre-examination Publication No. JP-A-04-206571 (an English abstract of which is available and the content of the English abstract is incorporated by reference in its entirety into this application) proposes to form an antireflection film in the photoelectric conversion region. In the following, the prior art typified by JP-A-04-206571 will be called a second prior art.

Now, the second prior art will be described with reference to FIG. 18. In FIG. 18, elements corresponding to those shown in FIG. 17 are given the same reference numbers.

In this second prior art, for example, an n-type semiconductor region 17 becoming a photoelectric conversion region for obtaining a signal charge, and a second n-type semiconductor region 21 becoming a transfer region for transferring the signal charge read out from the n-type semiconductor region 17, are formed in a principal surface of the P-type silicon substrate 11. The n-type semiconductor region 17 and the second n-type semiconductor region 18 are formed by for example an impurity diffusion. Incidentally, pixels are isolated from one another by a $p^+$ semiconductor region 26.

Furthermore, a seventh insulating film 12g formed of a silicon oxide film is formed on the P-type silicon substrate 11. On the silicon oxide film 12g, there is formed an antireflection film 15 formed of a silicon nitride film having a refractive index larger than that of silicon oxide but smaller than that of silicon. The refractive index of the silicon oxide is about 1.45, and the refractive index of the silicon nitride is about 2.0. Film thicknesses of the seventh insulating film 12g and the antireflection film 15 are not greater than 600 Å, respectively, and preferably on the order of 250 Å to 350 Å, respectively.

By setting the film thicknesses, an antireflection film having a relatively flat spectral characteristics in a visible light region can be obtained. Thus, by setting the film thicknesses of the seventh insulating film 12g and the antireflection film 15 to an appropriate thickness, the reflection factor is suppressed to 12% to 13% at average. Since the incident light was reflected about 40% in the prior art P-type silicon substrate, the reflection factor can be reduced to about one third.

A polysilicon layer functioning as a transfer electrode 3 is formed through the sixth insulating film 12f on the silicon oxide film 12g and the antireflection film 15 above the transfer region. The transfer electrode 3 is coated with an eighth insulating film 12h formed of a silicon oxide film, and furthermore, is coated with the light block film 16 in order to block the incident light. The light block film 16 is formed of for example aluminum. An aperture is formed on the light block film 16 positioned above the n-type semiconductor region 17 so that the light block film 16 faces onto the n-type semiconductor region 17 in the aperture. The light block film 16 is overcoated with a passivation film 18. With this arrangement, a high sensitivity can be realized.

However, the above mentioned structure has the following problems:

A method for effectively reducing a dark current in the solid state image sensor is to diffuse hydrogen, as disclosed in for example Japanese Patent Application Pre-examination Publication No. JP-A-06-209100 (an English abstract of which is available and the content of the English abstract is incorporated by reference in its entirety into this application).

In the structure in accordance with the second prior art, it is not possible to sufficiently perform the terminating of dangling bonds at a silicon interface by hydrogen in a final sintering step, which is effective in reducing the dark current. The reason for this is as follows: When the sintering is executed after the antireflection film of the silicon nitride film is formed, hydrogen is prevented from reaching the silicon interface by action of the silicon nitride film of the antireflection film.

Incidentally, the solid state image sensor disclosed in JP-A-06-209100 has no antireflection film, and JP-A-06-209100 does not disclose a method for reducing the dark current when the antireflection film is provided.

A second problem is that since a driving characteristics of the transfer region is limited, it becomes difficult to lower a driving voltage of the transfer electrode. In order to increase the sensitivity in the visible light region, it is necessary to form the antireflection film having the film thickness on the order of 300 Å to 500 Å. If the antireflection film of this film thickness is actually formed on the whole surface, the film thickness is the same between the photoelectric conversion region and the transfer region, and therefore, the film thickness in the transfer region is also on the order of 300 Å to 500 Å.

On the other hand, in order to drive the transfer electrode with a low voltage, it is necessary to make the capacitance directly under the transfer electrode as small as possible. For this purpose, it is necessary to make the oxide film directly under the transfer electrode as thick as possible. Because of this, it is difficult to lower the driving voltage of the transfer electrode.

SUMMARY OF THE INVENTION

Accordingly, it is an object of the present invention to provide a solid state image sensor having an elevated sensitivity without influencing the driving characteristics of the transfer electrode, and a method for fabricating the solid state image sensor.

Another object of the present invention is to provide a solid state image sensor having an elevated sensitivity and a reduced dark current, without influencing the driving characteristics of the transfer electrode, and a method for fabricating the solid state image sensor.

The above and other objects of the present invention are achieved in accordance with the present invention by a solid state image sensor comprising a plurality of photoelectric conversion regions and a plurality of transfer regions which are formed in a principal surface of a semiconductor substrate, and a plurality of transfer electrodes formed above the transfer regions, wherein the improvement comprises a first insulating film, an antireflection film and a second insulating film formed in the named order on each of the photoelectric conversion regions, the antireflection film having a refractive index larger than that of the second insulating film but smaller than that of the semiconductor substrate, and the stacked film composed of the first insulating film, the antireflection film and the second insulating film being formed, in the transfer regions, to extend over the transfer electrode which is formed on a third insulating film formed on the semiconductor substrate.

In one embodiment, the antireflection film has an opening formed to penetrate through the antireflection film, at a position above the transfer electrode.

The first insulating film is formed of a silicon oxide film. Preferably, the first insulating film is formed of a silicon oxide film formed by a LPCVD process. Alternatively, the first insulating film is formed of a silicon oxide film which is formed by a LPCVD process and then heat-treated at a temperature higher than a growth temperature in the LPCVD process. Here, preferably, the first insulating film has a film thickness of not greater than 500 Å.

In addition, the antireflection film is formed of a material selected from the group consisting of silicon nitride, tantalum oxide and titanium oxide strontium. Preferably, the antireflection film is formed of silicon nitride formed by a plasma CVD process. Furthermore, the third insulating film is formed of a multilayer film selected from the group consisting of a silicon oxide film-silicon nitride film-silicon oxide film and a silicon oxide film-silicon nitride film.

According to another aspect of the present invention, there is provided a method for fabricating a solid state image sensor, comprising the steps of forming a plurality of photoelectric conversion regions and a plurality of transfer regions in a principal surface of a semiconductor substrate, forming a plurality of transfer electrodes above the transfer through a third insulating film, forming a first insulating film over the whole surface including the photoelectric conversion regions and the transfer electrodes, forming on the first insulating film an antireflection film having a refractive index smaller than that of the semiconductor substrate, and forming on the antireflection film a second insulating film having a refractive index smaller than that of the antireflection film.

In one embodiment, after the antireflection film is formed, an opening is formed to penetrate through the antireflection film, at a position above the transfer electrode. The first insulating film is formed of a silicon oxide film. Preferably, the first insulating film is formed of a silicon oxide film formed by a LPCVD process. Alternatively, the first insulating film is formed of a silicon oxide film which is formed by a LPCVD process and then heat-treated at a temperature higher than a growth temperature in the LPCVD process. Here, preferably, the first insulating film has a film thickness of not greater than 500 Å.

In another embodiment, the antireflection film is formed of a material selected from the group consisting of silicon nitride, tantalum oxide and titanium oxide strontium. Preferably, the antireflection film is formed of silicon nitride formed by a plasma CVD process. On the other hand, the third insulating film is formed of a multilayer film selected from the group consisting of a silicon oxide film-silicon nitride film-silicon oxide film and a silicon oxide film-silicon nitride film. Furthermore, preferably, after the second insulating film is formed, a sintering is carried out in a hydrogen atmosphere.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the present invention will be described with reference to the accompanying drawings.

First Embodiment

Figure 1:
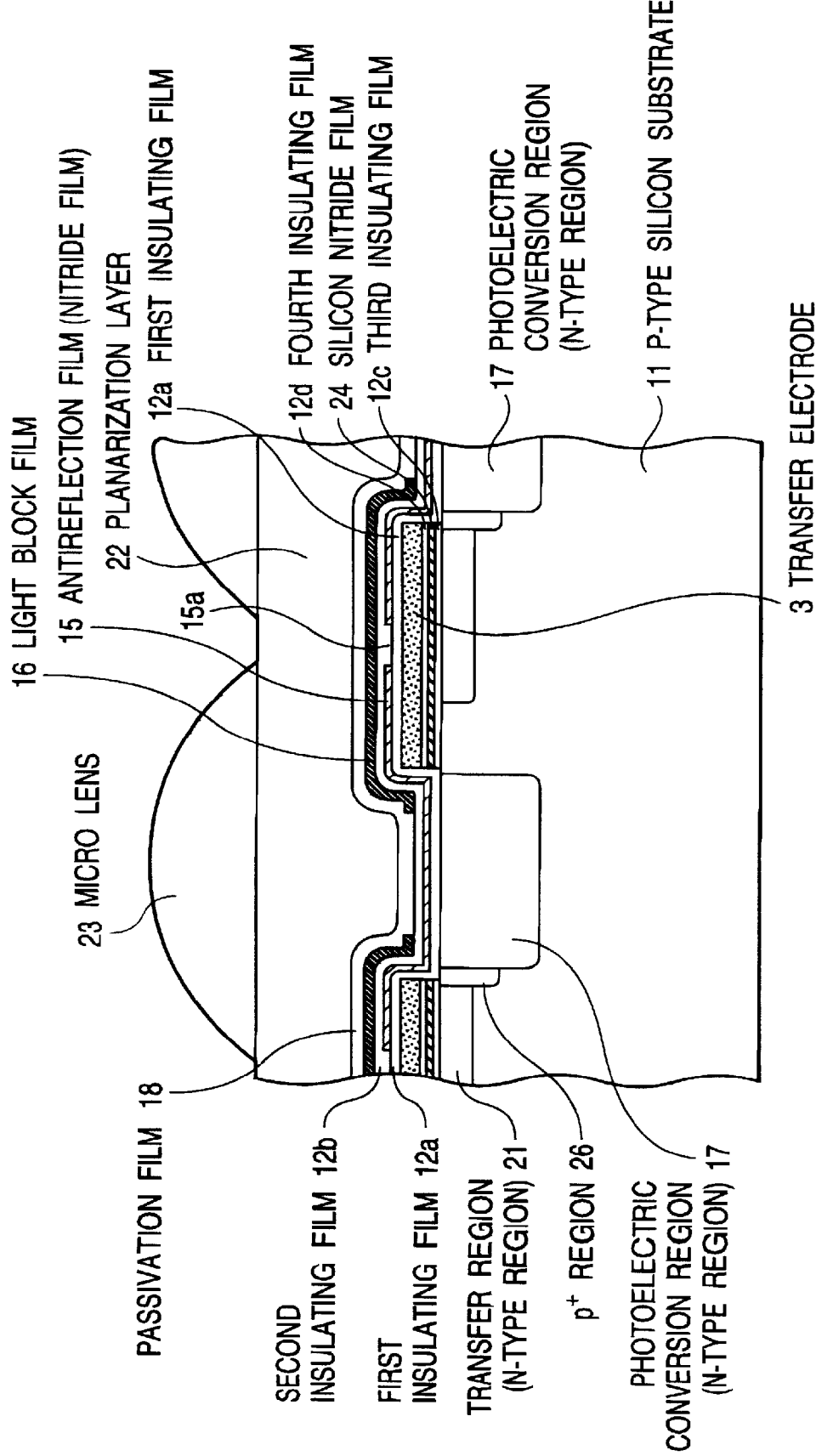
FIG. 1 is a sectional view of a first embodiment of the solid state image sensor in accordance with the present invention.
Figure 18:
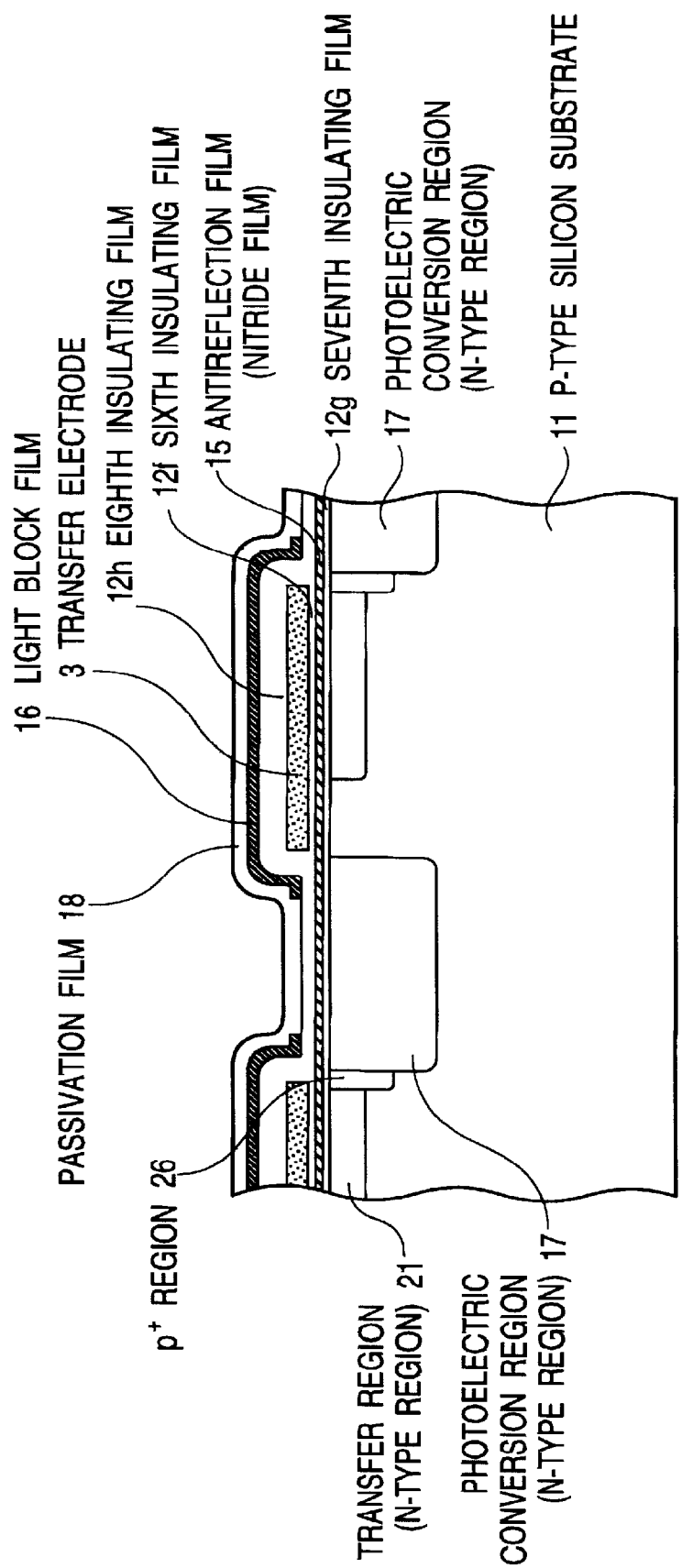
FIG. 18 is a sectional view of the solid state image sensor of the second prior art.

Referring to FIG. 1, there is shown a sectional view of a first embodiment of the solid state image sensor in accordance with the present invention. To make it easier to compare this embodiment with the solid state image sensor of the second prior art, the sectional view of FIG. 1 is similar to that of FIG. 8, and elements similar to those shown in FIG. 18 are given the same reference numbers.

The first embodiment of the solid state image sensor shown in FIG. 1 includes a P-type silicon substrate 11. In a principal surface of the P-type silicon substrate 11, a plurality of n-type semiconductor regions 17 each becoming a photoelectric conversion region, a plurality of second n-type semiconductor regions 21 each becoming a transfer region, and a plurality of $p^+$ semiconductor regions 26 for isolating pixels from one another, are formed. On the n-type semiconductor region 17 in the P-type silicon substrate 11, a thin silicon oxide film is formed to constitute a first insulating film 12a. On this thin silicon oxide film 12a, there is formed an antireflection film 15 formed of a silicon nitride film having a reflective index larger than that of silicon oxide but smaller than that of silicon. In the transfer region, this antireflection film 15 is formed above a transfer electrode 3 with the first insulating film 12a of the silicon oxide film being interposed between the antireflection film 15 and the transfer electrode 3. In addition, the antireflection film 15 formed above the transfer electrode 3 is partially removed to form an opening 15a for supplying hydrogen from an external.

In the transfer region, on the silicon substrate 11 there is formed a so-called ONO film which is formed by depositing a silicon oxide film 12c (third insulating film) on a silicon interface, and by depositing a silicon nitride film 24 (second silicon nitride film) on the silicon oxide film 12c, and then by depositing a silicon oxide film 12d (fourth insulating film) on the second silicon nitride film 24. On this ONO film, the transfer electrode 3 is formed. Thus, the antireflection film 15 formed of the silicon nitride film and the second silicon nitride film 24 are separated from each other by the first insulating film 12a, so that the silicon nitride film 15 and the second silicon nitride film 24 are in no contact with each other.

The antireflection film 15 is coated with a second insulating film 12b formed of a silicon oxide film, and further coated with a light blocking film 16 in order to block the incident light. This light blocking film 16 is formed of tungsten or aluminum. An aperture is formed to penetrate through the light block film 16 positioned above the n-type semiconductor region 17 so that the light block film 16 faces onto the n-type semiconductor region 17 in the aperture. The light block film 16 is overcoated with a passivation film 18. A planarization layer 22 is formed to cover the passivation film 18, and micro lens 23 are formed on the planarization layer 22, as shown.

With the above mentioned structure, a high sensitivity can be realized with giving no adverse influence to a vertical driving characteristics, which was a problem in the prior art. In addition, in the structure shown in FIG. 1, a dark current is greatly reduced if the sintering in a hydrogen atmosphere is carried out after the opening 15a is formed in the antireflection film 15 above the transfer region as shown in FIG. 1. However, a detailed explanation of this sintering process and an advantage obtained by the sintering will be made when a method in accordance with the present invention for fabricating the first embodiment of the solid state image sensor will be described later.

Now, why the sensitivity is elevated will be described. Ordinarily, about 30% of a visible light incident on a silicon-oxide interface is reflected. This is a cause for lowering the sensitivity. A high reflection factor of the silicon-oxide interface is because a difference in refractive index between the silicon and the silicon oxide is large (the refractive index of the silicon is about 3 to 4, and the refractive index of the silicon oxide is about 1.4). In order to make this reflection factor as small as possible, a film having the refractive index larger than of the silicon oxide but smaller than that of silicon is used as the antireflection film. As a result, an incidence efficiency to the silicon can be elevated, so that the sensitivity can be improved.

Figure 2:
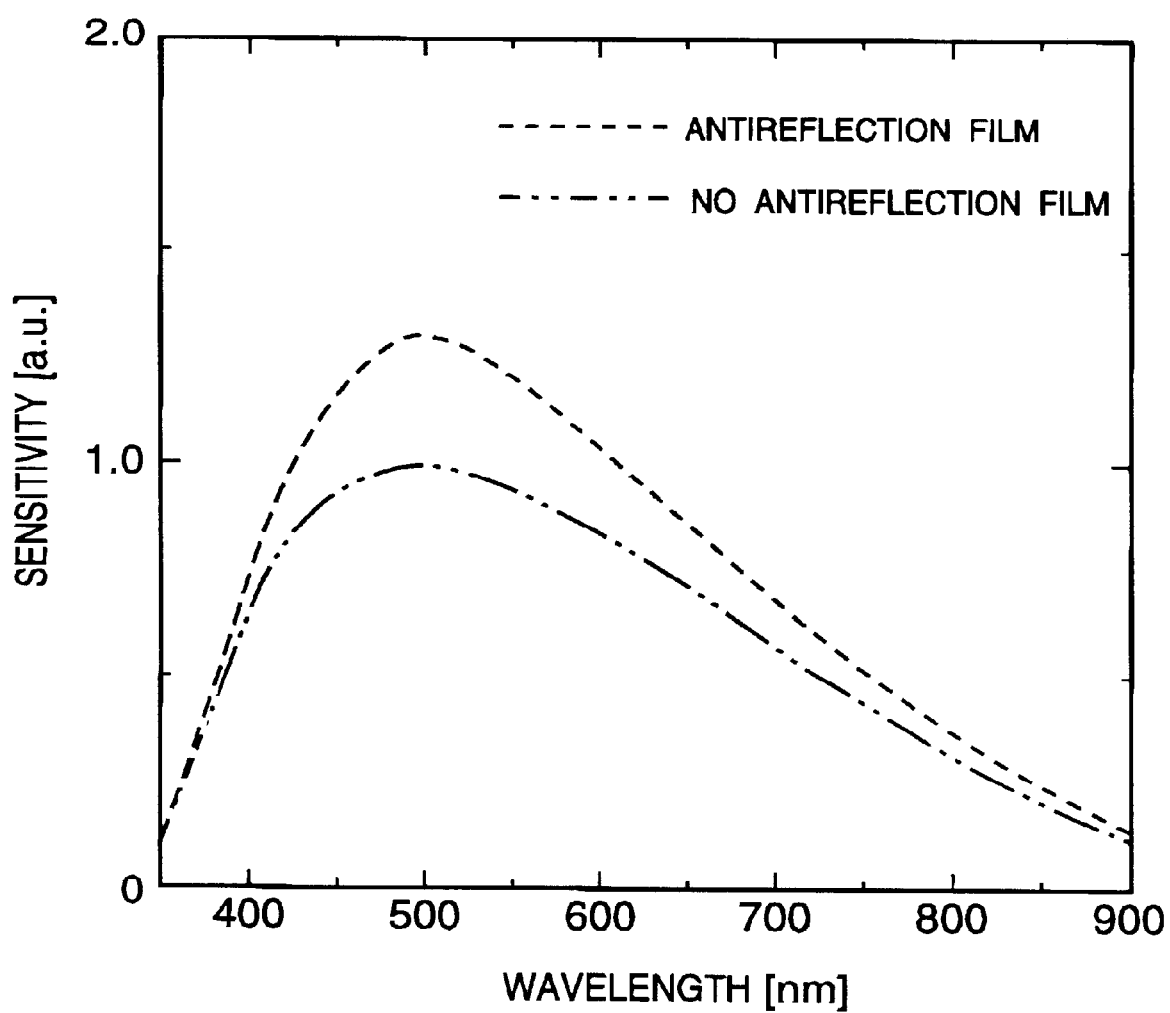
FIG. 2 is a graph illustrating the difference between the solid state image sensor in accordance with the present invention and the solid state image sensor of the prior art.

The result of an experiment of the spectral sensitivity is shown in FIG. 2. It would be understood that by forming the antireflection film, the incidence efficiency to the silicon is elevated, and the sensitivity is elevated about 23%.

This first embodiment is characterized in that no antireflection film is formed between the transfer electrode and the silicon substrate. Therefore, it is possible to design the film thickness of the silicon oxide film under the transfer electrode and the film thickness of the silicon oxide film under the antireflection film in the photoelectric conversion region, independently of each other. Accordingly, the driving characteristics of the transfer electrode is not restricted at all by the film thickness of the antireflection film.

Now, a method in accordance with the present invention for fabricating the first embodiment of the solid state image sensor will be described with reference to FIGS. 3 to 8.

Figure 3:
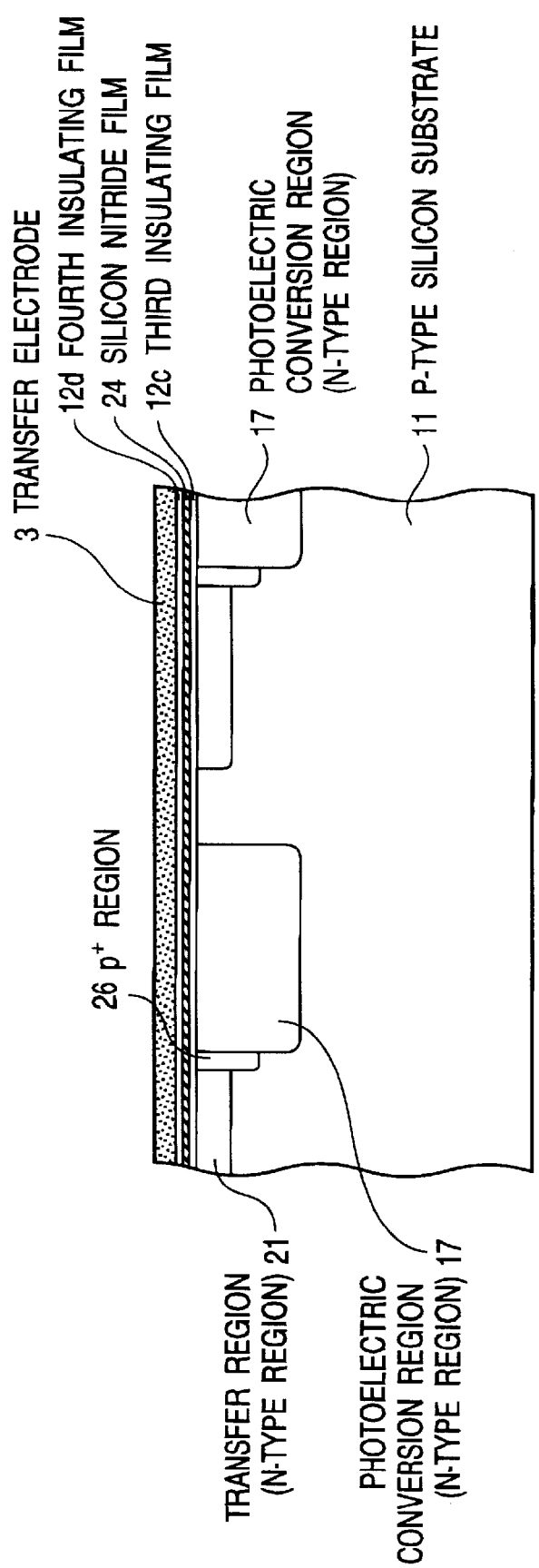
FIGS. 3 to 8 are sectional views for illustrating a method in accordance with the present invention for fabricating the first embodiment of the solid state image sensor.

FIG. 3 shows a condition that the n-type semiconductor regions 17, the second n-type semiconductor regions 21 and the p+ semiconductor regions 26 are formed in a principal surface of the semiconductor substrate 11, and the ONO film composed of the third silicon oxide film 12c, the second silicon nitride film 24 and the fourth silicon oxide film 12d, are formed on the principal surface of the semiconductor substrate 11, and furthermore, a polysilicon layer 3 becoming the transfer electrode are formed on the ONO film. The film thicknesses of the ONO film and the polysilicon layer 3 are as follows: The silicon oxide film 12c formed on the principal surface of the semiconductor substrate 11 has a film thickness of 400 Å, and the second silicon nitride film 24 formed on the silicon oxide film 12c has a film thickness of 200 Å. The fourth silicon oxide film 12d formed on the second silicon nitride film 24 has a film thickness of 200 Å, and the polysilicon layer 3 formed on the fourth silicon oxide film 12d has a film thickness of 2000 Å.

Figure 4:
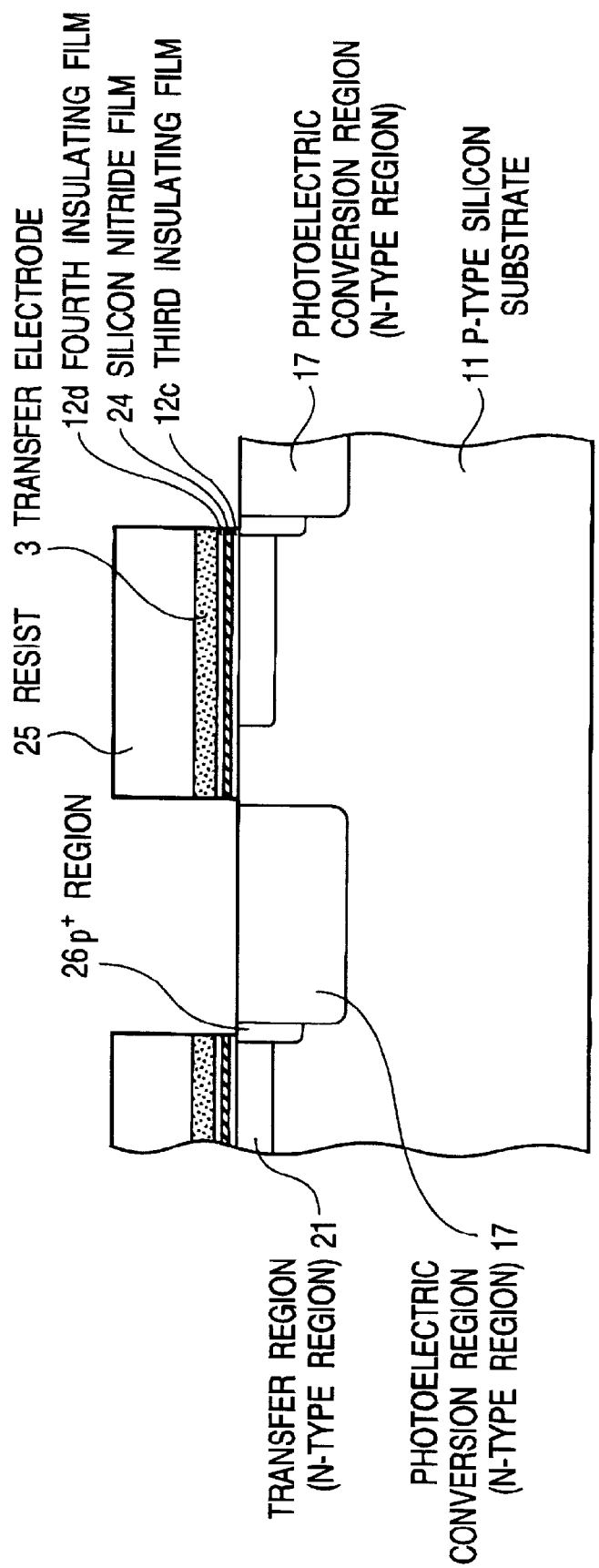

Thereafter, a resist pattern 25 is formed on the polysilicon layer 3, and then, the polysilicon layer 3 and the ONO film in the photoelectric conversion region are etched by using the resist pattern 25 as a mask, as shown in FIG. 4.

Then, the resist pattern 25 is removed, and the first insulating film 12a formed of the silicon oxide film is deposited on the whole surface. At this time, in order to surely separate the second silicon nitride film and the antireflection film from each other, it is preferred to form a silicon oxide film which has a uniform step coverage and whose film thickness can be precisely controlled. For this purpose, the first insulating film 12a of the silicon oxide film is formed by a LPCVD (low pressure chemical vapor deposition) process. Thereafter, a heat treatment may be carried out at a temperature higher than a growth temperature in the film deposition process. In addition, this film functions as a buffer film for relaxing a stress between the silicon substrate surface and the silicon nitride film of the antireflection film. In this regard, the thinner the film thickness is, the higher the sensitivity becomes. In particular, in order to elevate the sensitivity in the visible light range, the film thickness is preferred to be not greater than 5000 Å.

Figure 5:
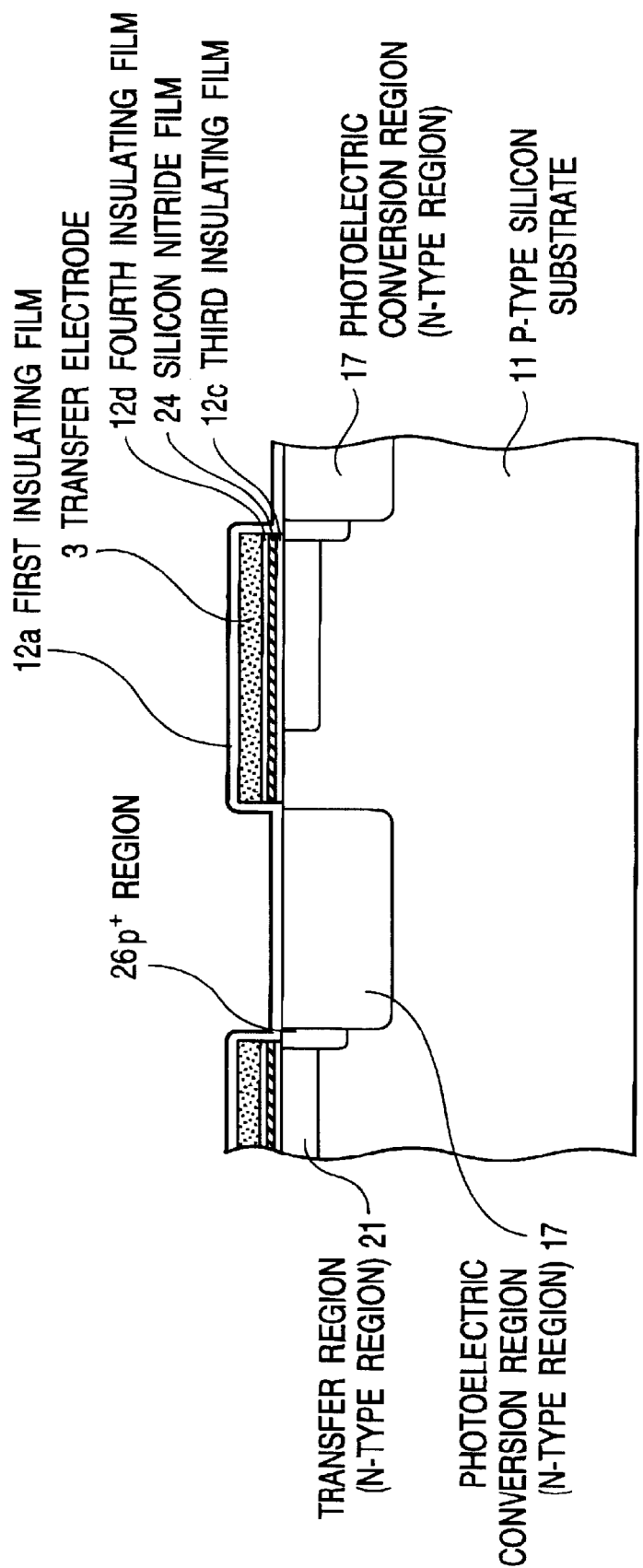
Figure 6:
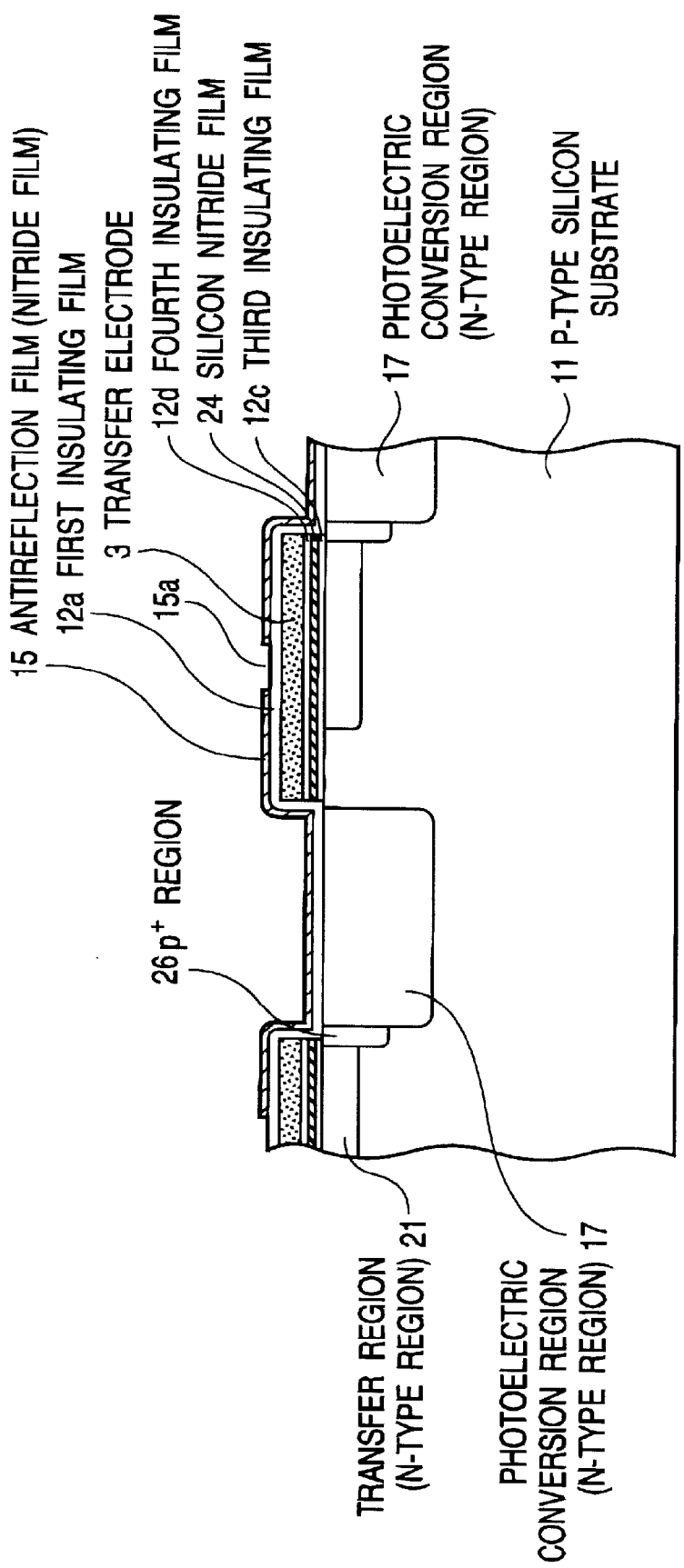

On whole surface of the silicon oxide film 12a formed as shown in FIG. 5, the antireflection film 15 formed of the silicon nitride film having the thickness of about 500 Å is formed. Thereafter, a portion of the antireflection film 15 positioned above the transfer electrode 3 is removed to form the opening 15a penetrating through the antireflection film 15, as shown in FIG. 6. Furthermore, the second insulating film 12b formed of the silicon oxide film is deposited to cover the antireflection film 15. After this process, an aluminum film 16 having a thickness of 3000 Å to 4000 Å is formed to constitute the light block film.

Figure 7:
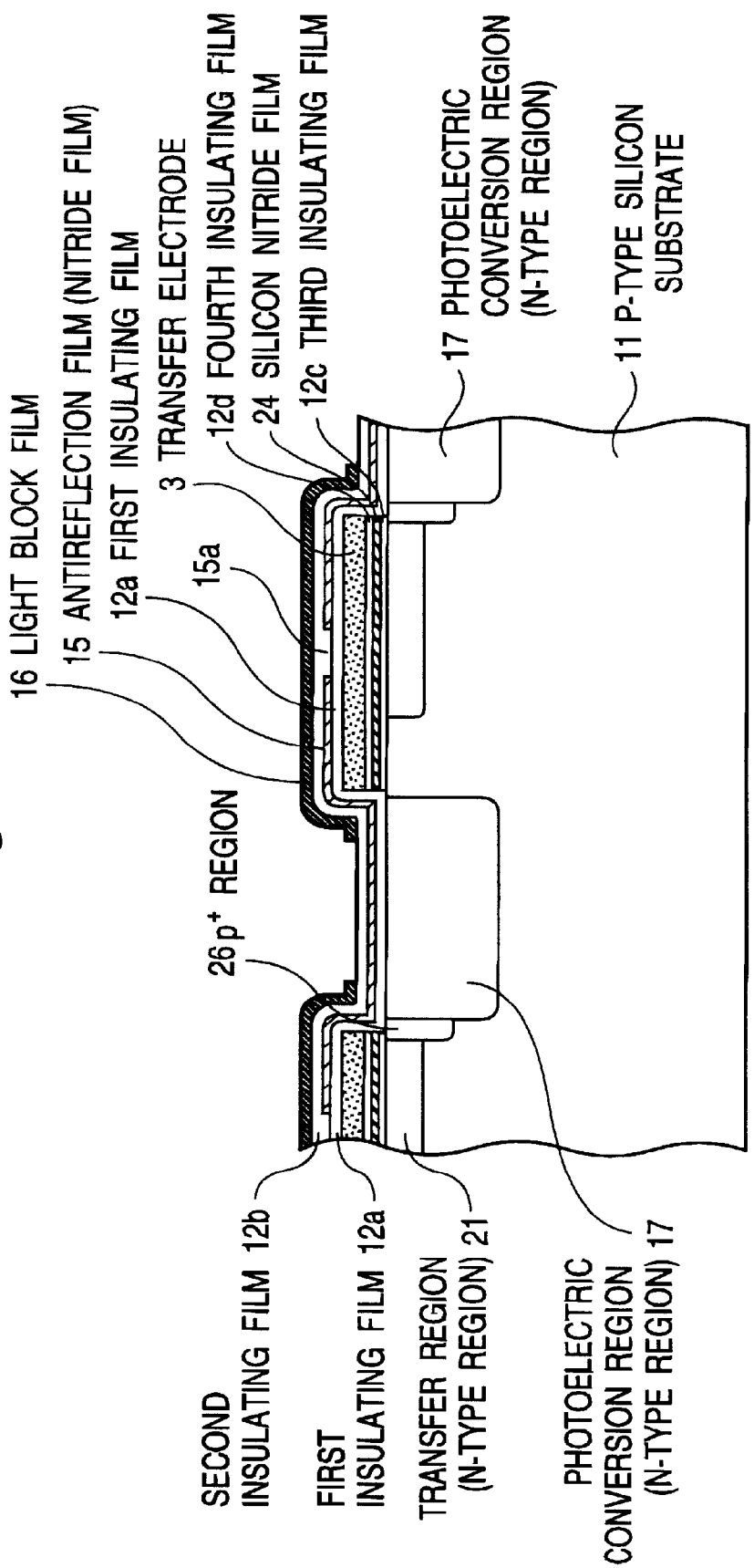

After the aluminum film 16 is formed, a portion of the aluminum film 16 located above the photoelectric conversion region is removed to form the aperture, as shown in FIG. 7.

Figure 8:
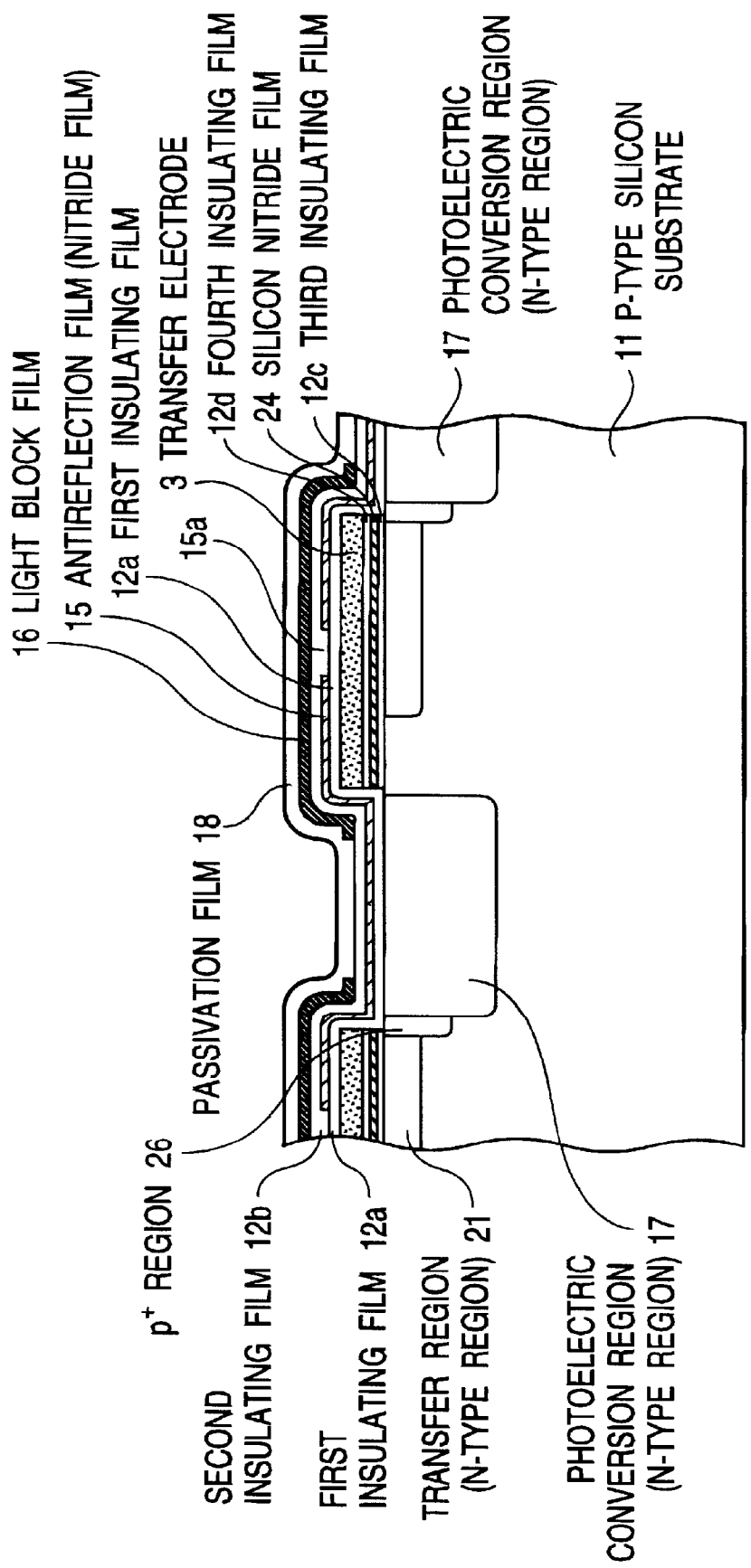

Thereafter, the passivation film 18 is formed on the whole surface, as shown in FIG. 8, and then, the sintering in the hydrogen atmosphere is carried out. The hydrogen permeates through the silicon oxide film 12b which is an interlayer film between the light block film 16 and the antireflection film 15, and then enters through the opening 15a formed in the antireflection film 15 to the silicon oxide film 12a under the antireflection film 15, and further permeates through the silicon oxide film 12a between the antireflection film 15 and the second silicon nitride film 24, and finally reaches the silicon interface at the principal surface of the substrate 11. The hydrogen having reached the silicon interface terminates dangling bonds at the silicon interface. As a result, the dark current is reduced.

Thereafter, as shown in FIG. 1, the planarization layer 22 and the micro lens 23 are formed. Thus, the first embodiment of the solid state image sensor shown in FIG. 1 is obtained.

As mentioned above, since the refractive index of the silicon oxide is about 1.45 and the refractive index of the silicon is about 3 to 4, the antireflection film 15 is formed of the silicon nitride film in this embodiment (the refractive index of the silicon nitride is about 2.0).

However, the antireflection film 15 can be formed of other materials, for example, tantalum oxide or titanium oxide strontium.

In addition, when the antireflection film 15 is formed of the silicon nitride film, since the silicon nitride film formed by a plasma CVD contains a large amount of hydrogen in the film, in comparison with the silicon nitride film formed by the LPCVD, the antireflection film 15 of the silicon nitride film formed by the plasma CVD is more effective in reducing the dark current.

Second Embodiment

Figure 9:
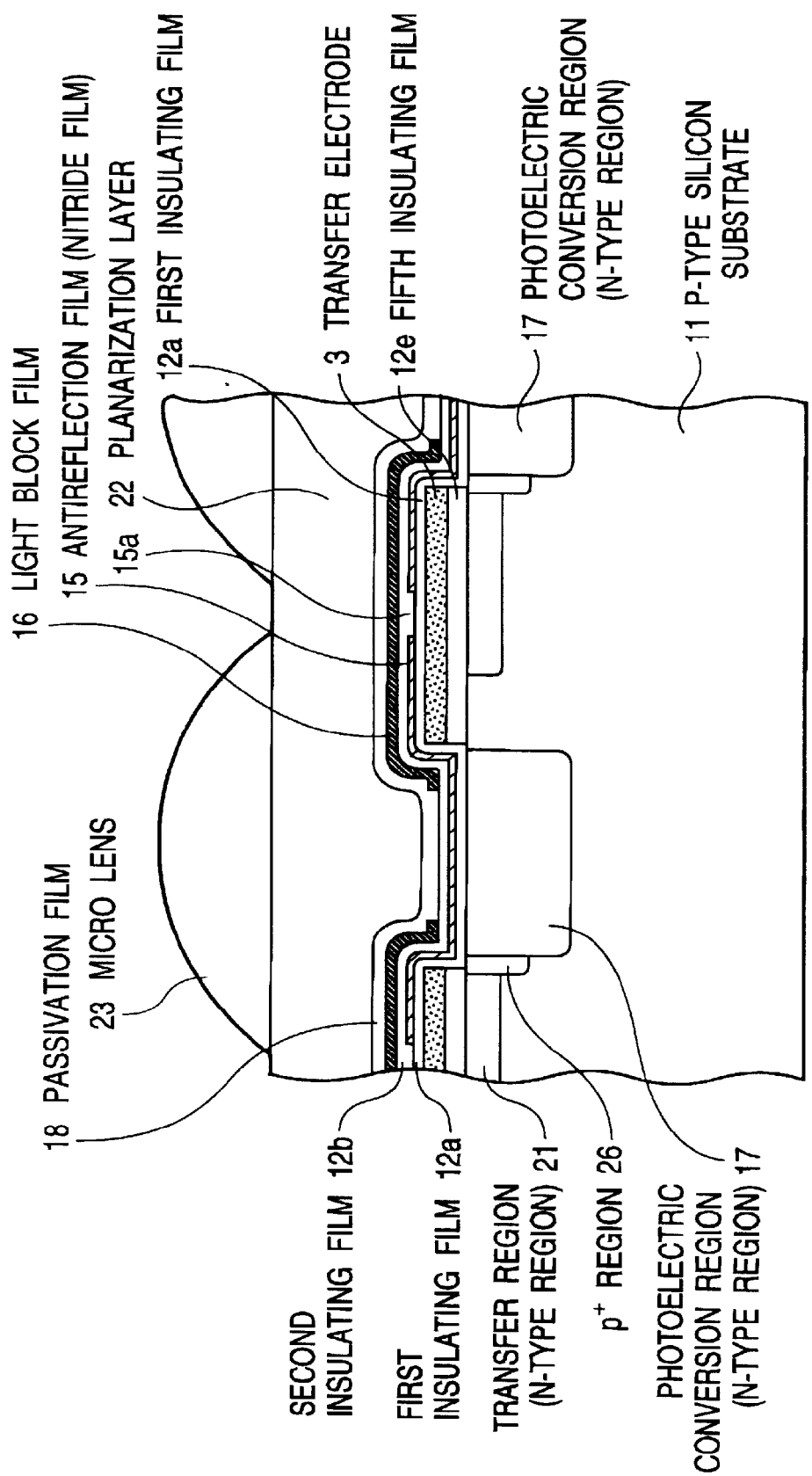
FIG. 9 is a sectional view of a second embodiment of the solid state image sensor in accordance with the present invention.

Referring to FIG. 9, there is shown a sectional view of a second embodiment of the solid state image sensor in accordance with the present invention. In FIG. 9, elements corresponding to those shown in FIG. 1 are given the same reference numbers, and explanation will be omitted for simplification of description.

In the first embodiment shown in FIG. 1, the ONO film is formed on the silicon interface in the transfer region, but in the second embodiment shown in FIG. 9, only a fifth insulating film 12e of a silicon oxide film is formed on the silicon interface in the transfer region, and the transfer electrode 3 is formed on the fifth insulating film 12e. Since the ONO film is not formed, the fabricating process can be shortened in comparison with the first embodiment. This is only the difference between the first and second embodiments.

Third Embodiment

Figure 10:
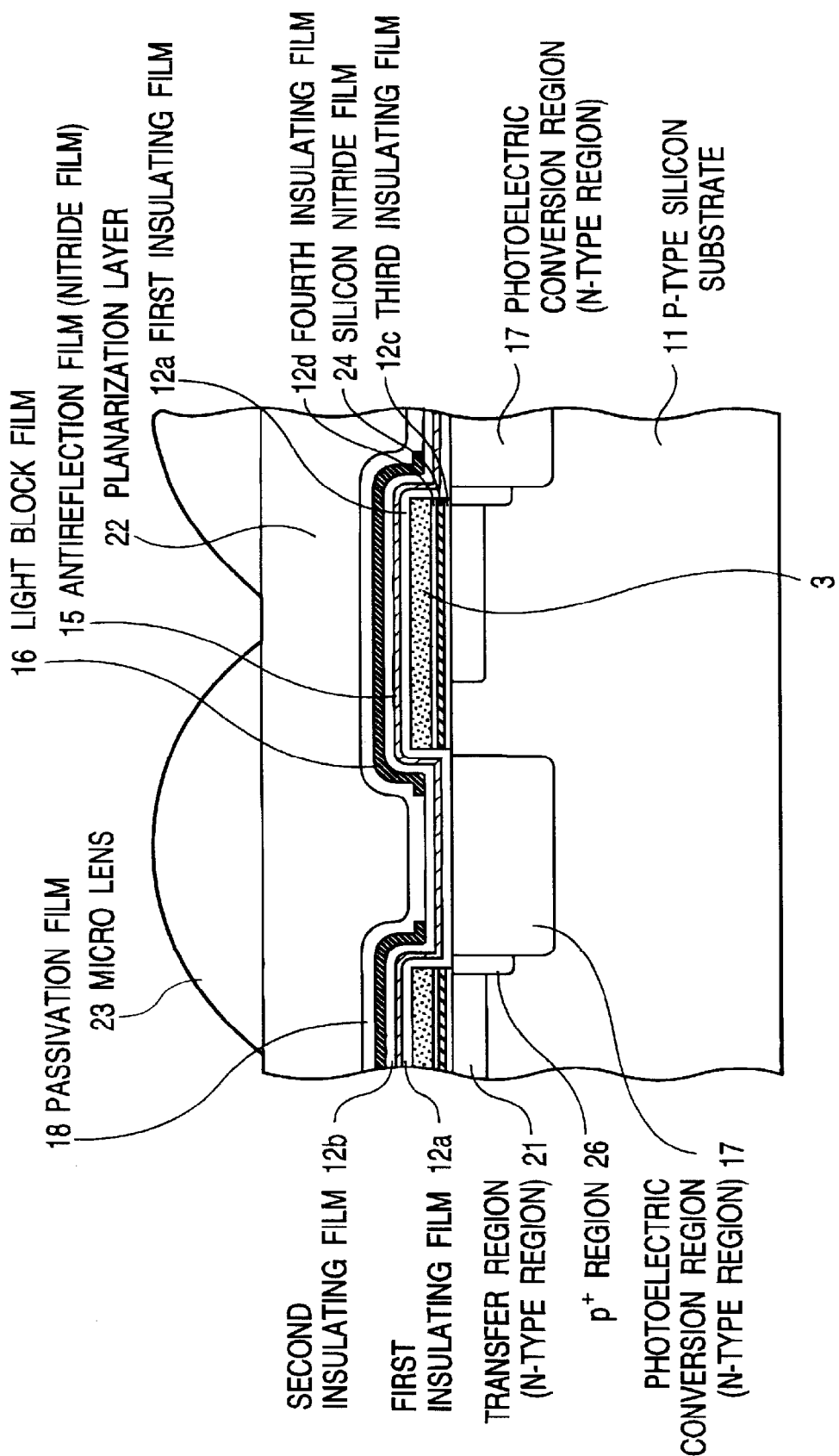
FIG. 10 is a sectional view of a third embodiment of the solid state image sensor in accordance with the present invention.

Referring to FIG. 10, there is shown a sectional view of a third embodiment of the solid state image sensor in accordance with the present invention. In FIG. 10, elements corresponding to those shown in FIG. 1 are given the same reference numbers, and explanation will be omitted for simplification of description.

As seen from comparison between FIG. 1 and FIG. 10, the third embodiment is different from the first embodiment only in that no opening 15a is formed in the antireflection film 15 positioned above the transfer electrode 3, and therefore, the antireflection film 15 completely covers an upper surface of the transfer electrode.

With this arrangement, the sensitivity can be elevated with giving no adverse influence to a vertical driving characteristics, which was a problem in the prior art, similarly to the first embodiment.

In addition, since the antireflection film 15 is formed to completely cover an upper surface of the transfer electrode, namely, since no opening 15a is formed in the antireflection film 15, the step for partially removing the antireflection film 15 to form the opening 15a is no longer necessary. Therefore, the fabricating process can be shortened in comparison with the first embodiment.

On the other hand, the effect for reducing the dark current cannot be expected. However, as mentioned above, since the silicon nitride film formed by the plasma CVD contains a large amount of hydrogen in the film, if the antireflection film 15 is constituted of the silicon nitride film formed by the plasma CVD, the hydrogen contained in the silicon nitride film formed by the plasma CVD, terminates dangling bonds at the silicon interface in the sintering process. As a result, the dark current is reduced.

Similarly to the first embodiment, the antireflection film 15 can be formed of not only the silicon nitride film but also other materials, for example, tantalum oxide or titanium oxide strontium. However, when the antireflection film 15 is formed of the material such as tantalum oxide or titanium oxide strontium, other than the silicon nitride, the effect for reducing the dark current cannot be expected.

In this third embodiment, the silicon oxide film 12a under the antireflection film in the photoelectric conversion region is preferred to be formed to have a film thickness of not greater than 500 Å, similarly to the first embodiment.

Now, a method in accordance with the present invention for fabricating the third embodiment of the solid state image sensor, will be described with reference to FIGS. 11 to 16.

Figure 11:
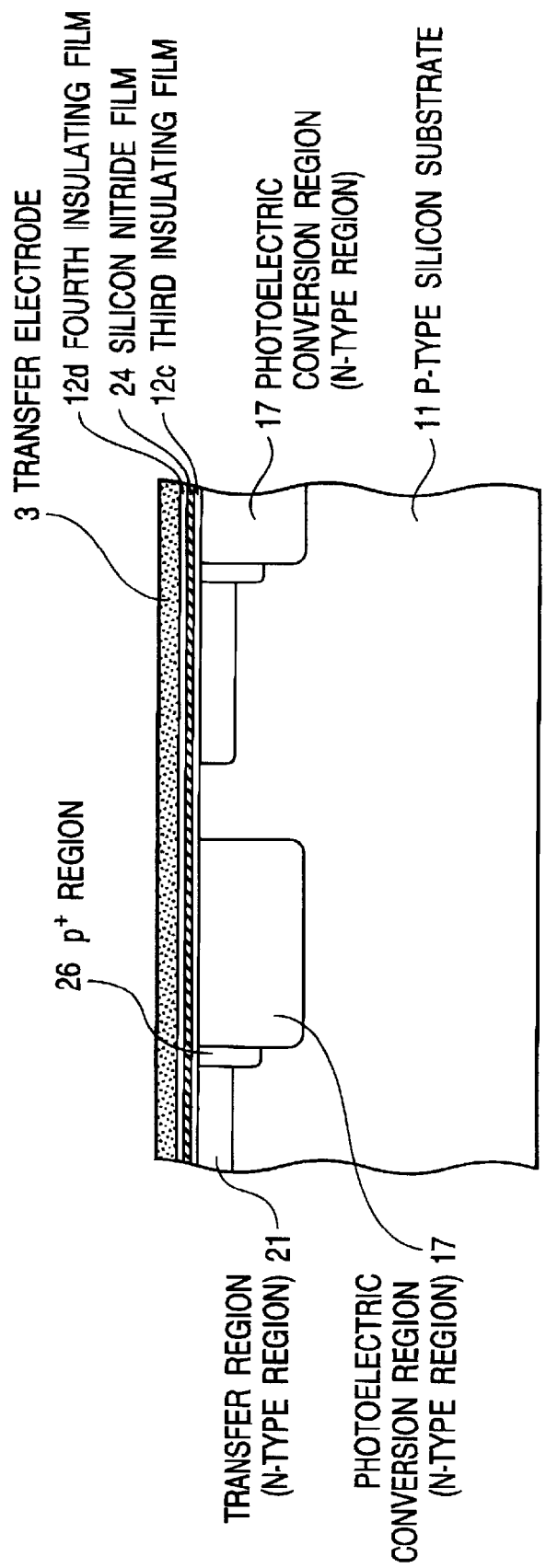
FIGS. 11 to 16 are sectional views for illustrating a method in accordance with the present invention for fabricating the third embodiment of the solid state image sensor.
Figure 12:
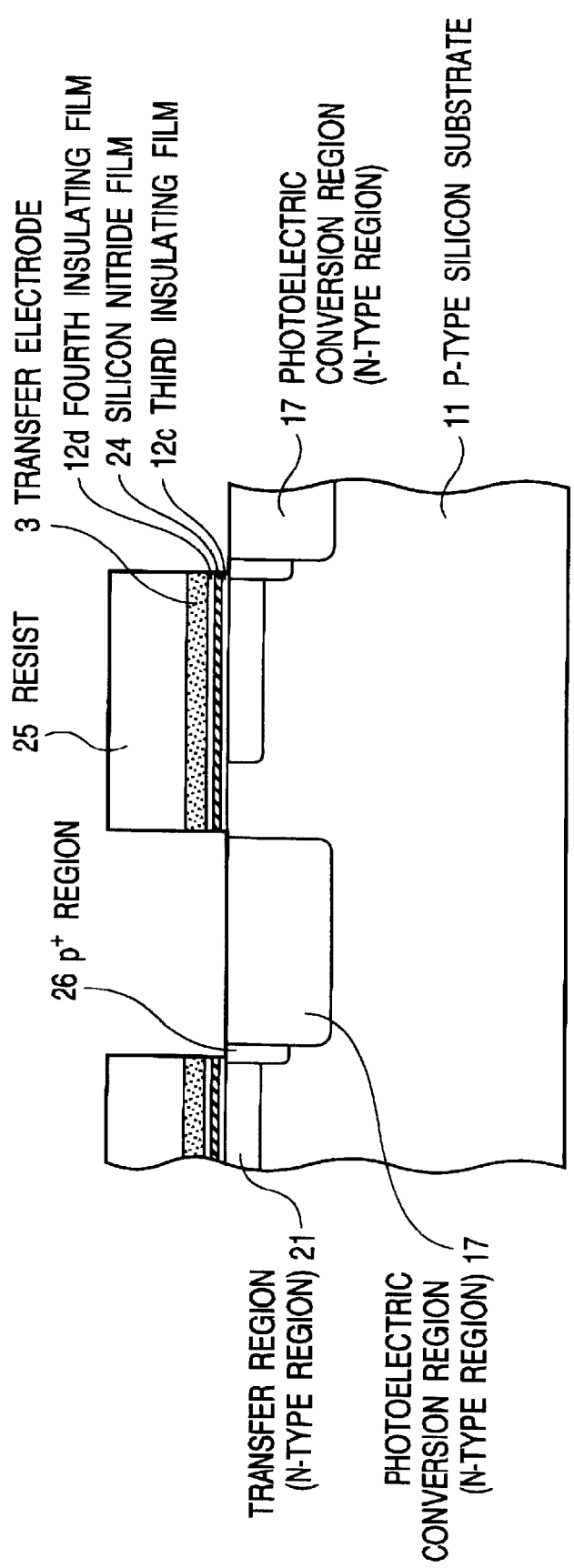
Figure 13:
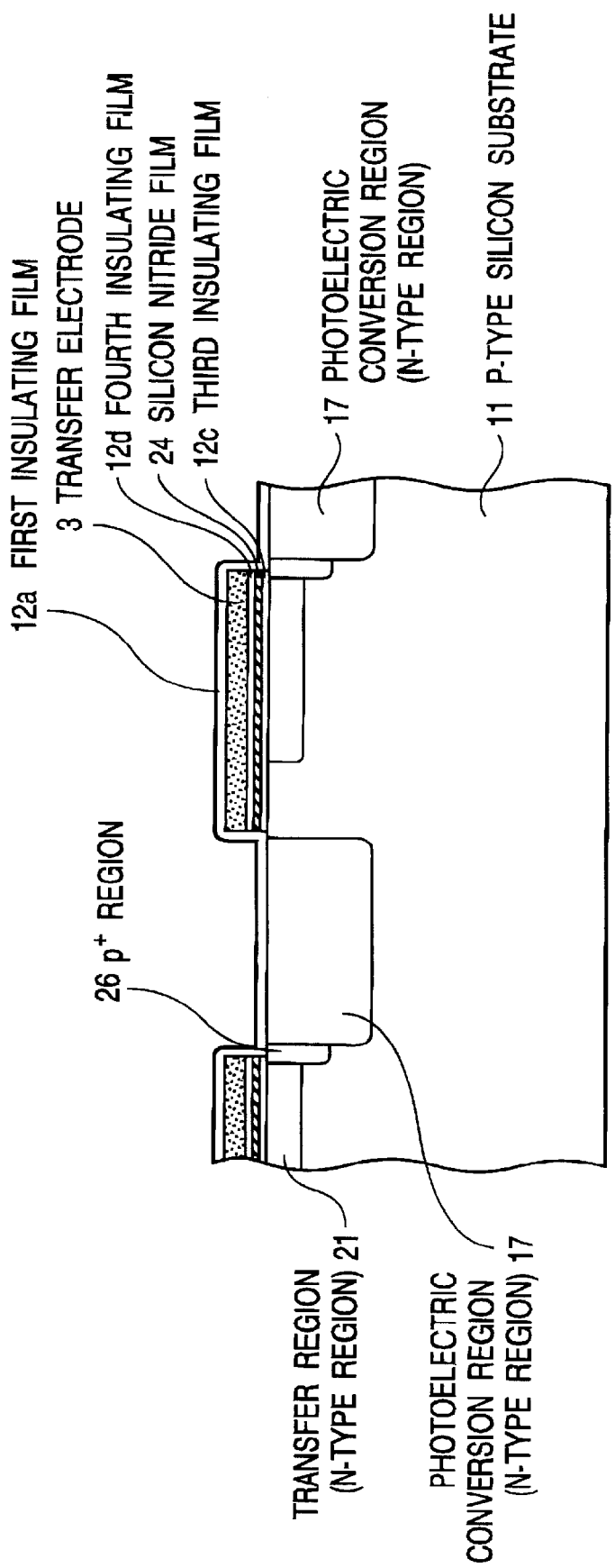
Figure 14:
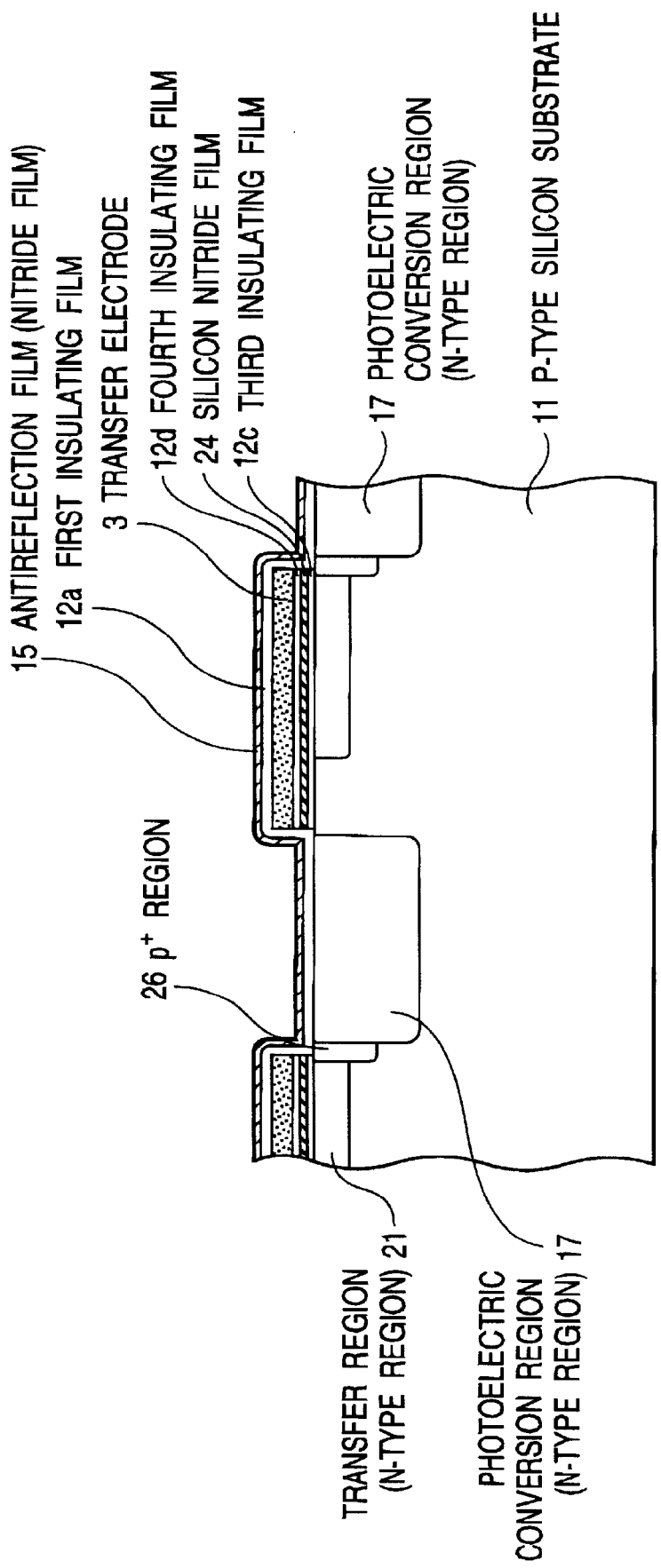

Since FIGS. 11 to 13 are the same as FIGS. 3 to 5, respectively, explanation will be omitted. Thereafter, as shown in FIG. 14, the antireflection film 15 formed of the silicon nitride film having the thickness of about 500 Å is formed to cover the whole surface of the silicon oxide film 12a. Furthermore, the silicon oxide film 12b is formed to cover the antireflection film 15, and the light block film 16 formed of aluminum or tungsten is formed on the silicon oxide film 12b.

Figure 15:
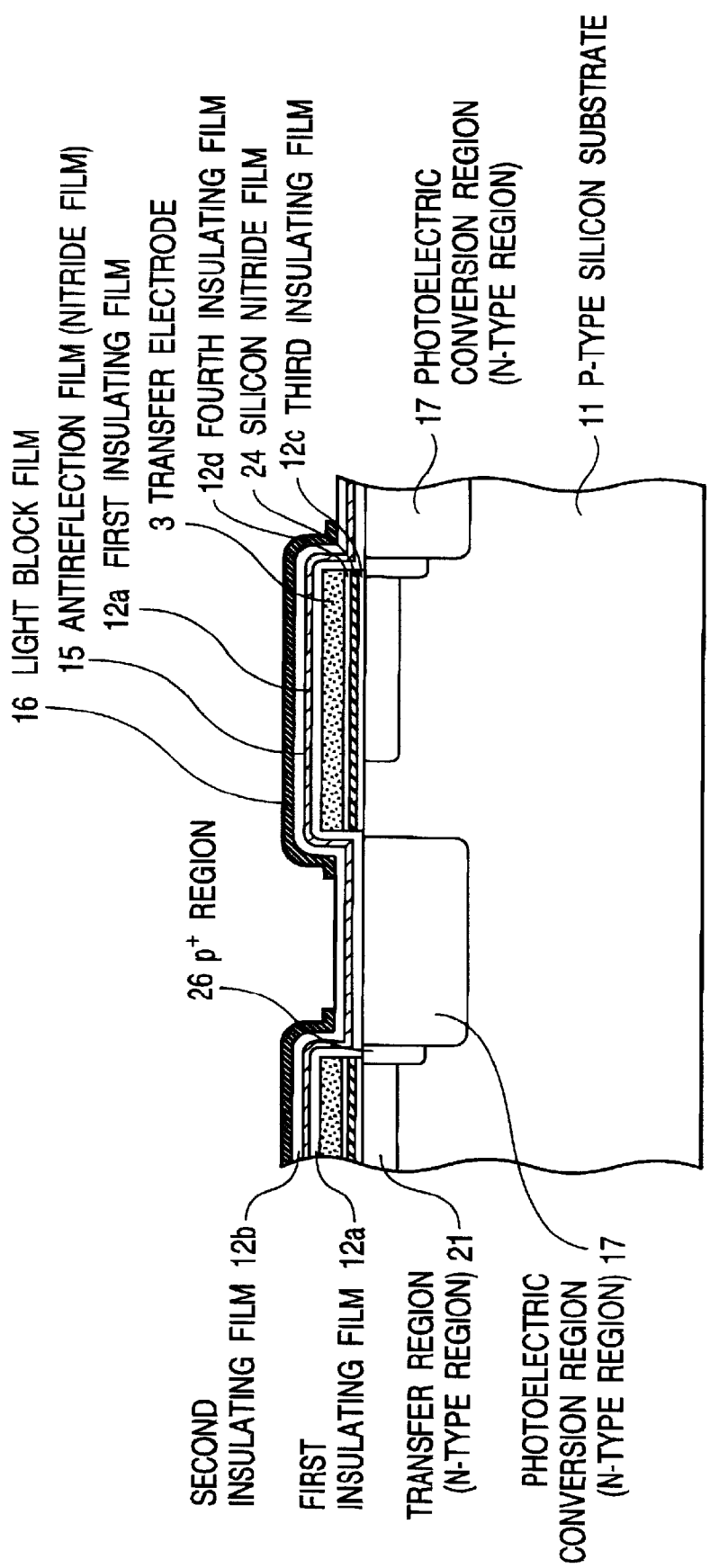

After the light block film 16 is formed, a portion of the light block film 16 located above the photoelectric conversion region is removed to form the aperture, as shown in FIG. 15.

Figure 16:
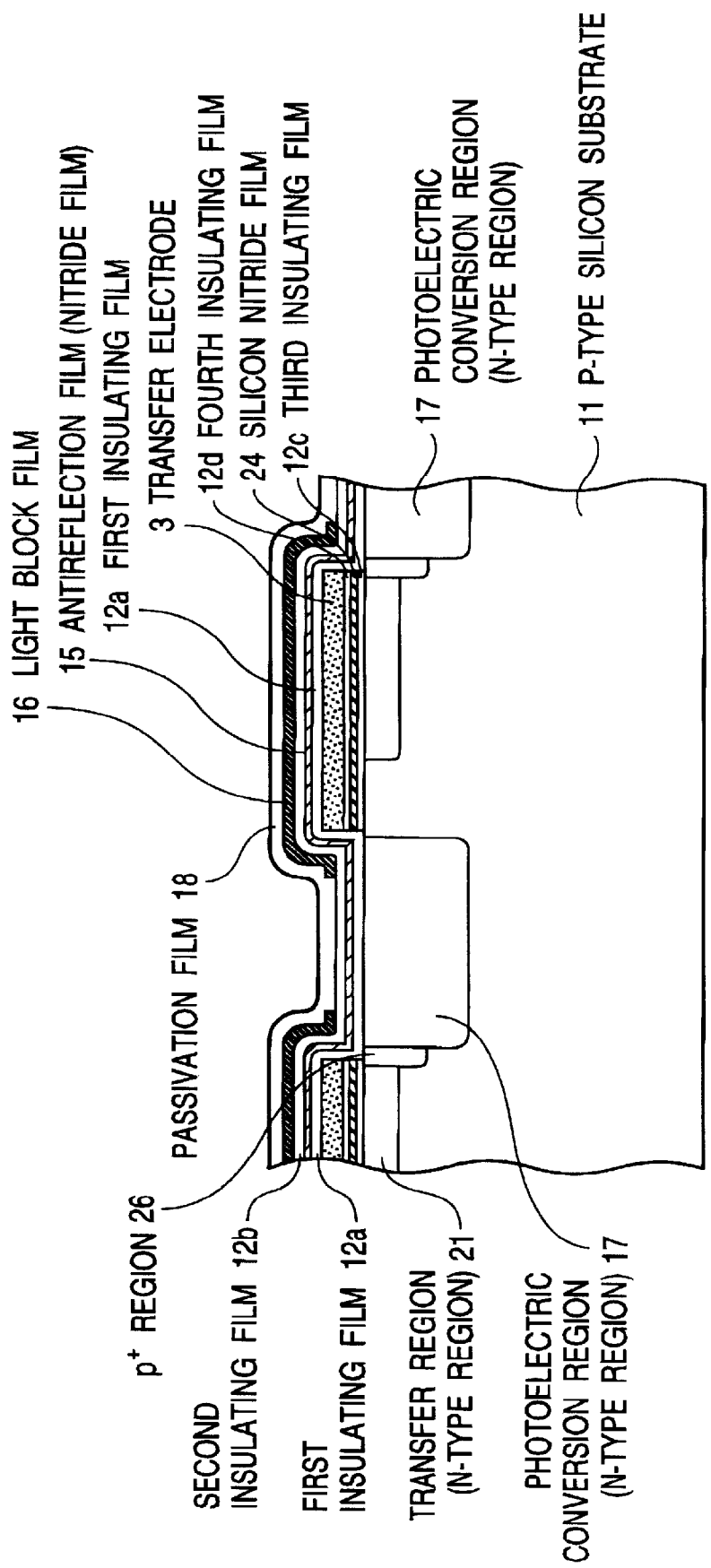
Figure 17:
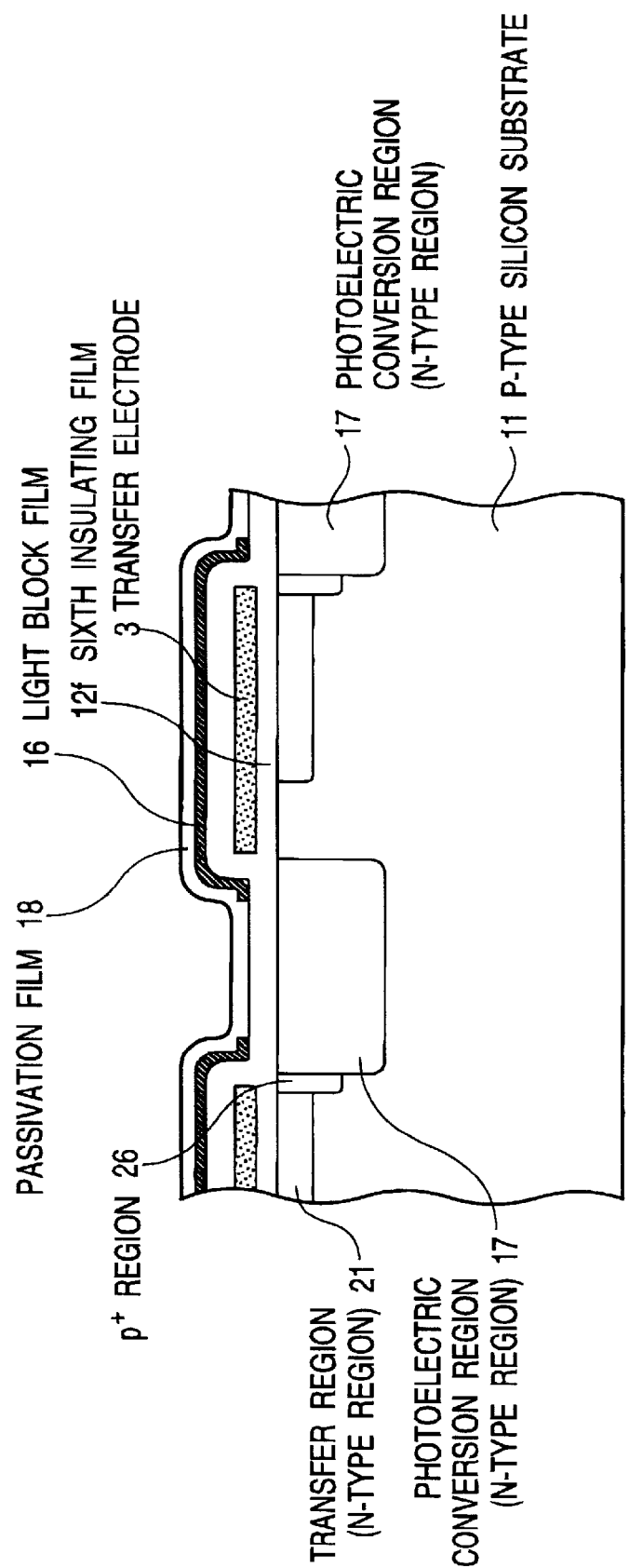
FIG. 17 is a sectional view of the solid state image sensor of the first prior art.

Thereafter, the passivation film 18 is formed on the whole surface, as shown in FIG. 16, and then, as shown in FIG. 10, the planarization layer 22 and the micro lens 23 are formed. Thus, the second embodiment of the solid state image sensor shown in FIG. 1 is obtained.

As seen from the above, according to the present invention, in order to elevate the sensitivity of the solid state image sensor, the antireflection film formed of for example the silicon nitride film, having a refractive index larger than that of silicon oxide but smaller than that of silicon, is formed on the n-type semiconductor region constituting the photoelectric conversion region, and on the other hand, the same antireflection film is formed above the transfer electrode in the transfer region. Accordingly, the sensitivity can be elevated without influencing the driving characteristics of the transfer electrode.

Furthermore, the portion of the antireflection film above the transfer electrode is removed to form the opening or the antireflection film is formed of the silicon nitride containing a large amount of hydrogen, and then, the sintering for supplying hydrogen is carried out. Therefore, since the dangling bonds at the silicon interface are terminated by hydrogen, the dark current can be greatly reduced.

The invention has thus been shown and described with reference to the specific embodiments. However, it should be noted that the present invention is in no way limited to the details of the illustrated structures but changes and modifications may be made within the scope of the appended claims.

What is claimed is:

1. A method for fabricating a solid state image sensor, comprising the steps of forming a plurality of photoelectric conversion regions, a plurality of p+ semiconductor regions, each of said p+ semiconductor regions contacting only one side of one of said photoelectric conversion regions, and a plurality of transfer regions in a principal surface of a semiconductor substrate, forming a plurality of transfer electrodes above said transfer regions through a third insulating film, forming a first insulating film over the whole surface including said photoelectric conversion regions and said transfer electrodes, said first insulating film contacting said transfer electrodes, forming on said first insulating film an antireflection film having a refractive index smaller than that of said semiconductor substrate, and forming on said antireflection film a second insulating film having a refractive index smaller than that of said antireflection film.

2. A method for fabricating a solid state image sensor, claimed in claim 1 wherein after said antireflection film is formed, an opening is formed to penetrate through said antireflection film, at a position above said transfer electrode.

3. A method for fabricating a solid state image sensor, claimed in claim 1 wherein said first insulating film is formed of a silicon oxide film.

4. A method for fabricating a solid state image sensor, claimed in claim 1 wherein said first insulating film is formed of a silicon oxide film formed by a LPCVD process.

5. A method for fabricating a solid state image sensor, claimed in claim 1 wherein said first insulating film is formed of a silicon oxide film which is formed by a LPCVD process and then heat-treated at a temperature higher than a growth temperature in said LPCVD process.

6. A method for fabricating a solid state image sensor, claimed in claim 1 wherein said first insulating film has a film thickness of not greater than 500 Å.

7. A method for fabricating a solid state image sensor, claimed in claim 1 wherein said antireflection film is formed of a material selected from the group consisting of silicon nitride, tantalum oxide and titanium oxide strontium.

8. A method for fabricating a solid state image sensor, claimed in claim 1 wherein said antireflection film is formed of silicon nitride formed by a plasma CVD process.

9. A method for fabricating a solid state image sensor, claimed in claim 1 wherein said third insulating film is formed of a multilayer film selected from the group consisting of a silicon oxide film-silicon nitride film-silicon oxide film and a silicon oxide film-silicon nitride film.

10. A method for fabricating a solid state image sensor, claimed in claim 2 wherein after said second insulating film is formed, a sintering is carried out in a hydrogen atmosphere.

11. A method for fabricating a solid state image sensor, claimed in claim 8 wherein after said second insulating film is formed, a sintering is carried out in a hydrogen atmosphere.

12. A method for fabricating a solid state image sensor, comprising the steps of:
    forming a plurality of photoelectric conversion regions and a plurality of transfer regions in a principal surface of a semiconductor substrate;
    forming a plurality of transfer electrodes above said transfer regions through a third insulating film;
    forming a first insulating film over the whole surface including said photoelectric conversion regions and said transfer electrodes;
    forming on said first insulating film an antireflection film having a refractive index smaller than that of said semiconductor substrate;
    forming an opening to penetrate through said antireflection film so as to reach said first insulating film, at a position above said transfer electrode; and
    forming on said antireflection film a second insulating film having a refractive index smaller than that of said antireflection film, so that said opening is filled up with said second insulating film.

13. A method for fabricating a solid state image sensor, claimed in claim 12 wherein said first insulating film is formed of a silicon oxide film which is formed by a LPCVD process and then heat-treated at a temperature higher than a growth temperature in said LPCVD process.

14. A method for fabricating a solid state image sensor, claimed in claim 12 wherein said first insulating film has a film thickness of not greater than 500 Å.

15. A method for fabricating a solid state image sensor, claimed in claim 12 wherein after said second insulating film is formed, a sintering is carried out in a hydrogen atmosphere.

16. A method for fabricating a solid state image sensor, comprising the steps of:
    forming a plurality of photoelectric conversion regions and a plurality of transfer regions in a principal surface of a semiconductor substrate;
    forming a plurality of transfer electrodes above said transfer regions through a third insulating film which is formed of a multilayer film selected from the group consisting of a silicon oxide film-silicon nitride film-silicon oxide film and a silicon oxide film-silicon nitride film;
    forming, as a first insulating film, a silicon oxide film by a LPCVD process, over the whole surface including said photoelectric conversion regions and said transfer electrodes;
    forming on said first insulating film an antireflection film which has a refractive index smaller than that of said semiconductor substrate and which is formed of a material selected from the group consisting of silicon nitride, tantalum oxide and titanium oxide strontium;
    forming an opening to penetrate through said antireflection film so as to reach said first insulating film, at a position above said transfer electrode; and
    forming on said antireflection film a second insulating film having a refractive index smaller than that of said antireflection film, so that said opening is filled up with said second insulating film.

17. A method for fabricating a solid state image sensor, claimed in claim 16 wherein after said silicon oxide film of said first insulating film is formed by said LPCVD process, said silicon oxide film of said first insulating film is heat-treated at a temperature higher than a growth temperature in said LPCVD process.

18. A method for fabricating a solid state image sensor, claimed in claim 16 wherein said first insulating film has a film thickness of not greater than 500 Å.

19. A method for fabricating a solid state image sensor, claimed in claim 16 wherein said antireflection film is formed of silicon nitride formed by a plasma CVD process.

20. A method for fabricating a solid state image sensor, claimed in claim 16 wherein after said second insulating film is formed, a sintering is carried out in a hydrogen atmosphere.

* * * * *